(12) United States Patent
Youfa

(10) Patent No.: US 7,598,511 B2
(45) Date of Patent: Oct. 6, 2009

(54) ENERGY SAVING DRIVING CIRCUIT AND ASSOCIATED METHOD FOR A SOLID STATE RELAY

(75) Inventor: Wang Youfa, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/944,532

(22) Filed: Nov. 23, 2007

(65) Prior Publication Data

US 2009/0134314 A1     May 28, 2009

(51) Int. Cl.
    *G02B 27/00*     (2006.01)
(52) U.S. Cl. ............................. 250/551; 250/214 SW
(58) Field of Classification Search ............. 250/214 R, 250/214 SW, 214 DC, 551
See application file for complete search history.

(56) References Cited

U.S. PATENT DOCUMENTS

| | | | |
|---|---|---|---|
| 4,031,432 A | 6/1977 | Proctor | |
| 4,093,877 A | 6/1978 | Pollmeier | |
| 4,370,701 A | 1/1983 | Western | |
| 4,680,490 A | 7/1987 | Baker et al. | |
| 6,140,776 A * | 10/2000 | Rachwal | 315/200 R |
| 6,897,487 B2 | 5/2005 | Yamaguchi | |
| 7,079,092 B2 * | 7/2006 | Tanghe et al. | 345/76 |
| 2003/0209994 A1 | 11/2003 | Kerenyi, Jr. | |
| 2006/0170042 A1 | 8/2006 | Yang et al. | |
| 2006/0170043 A1 | 8/2006 | Liu et al. | |

\* cited by examiner

*Primary Examiner*—Thanh X Luu
*Assistant Examiner*—Francis M Legasse, Jr.

(57) ABSTRACT

An energy saving driving circuit and method is provided for use with a solid state relay (SSR). The circuit and method reduce the overall energy required to drive a solid state relay by maintaining the SSR in an "on" state with a minimal maintenance or holding current after applying a turn-n current. The driving circuit includes a control circuit configured for outputting a control signal; a turn-on circuit configured for providing an output current at a first current level for a first time period in response to the control signal; and a holding circuit configured for maintaining said output current at a second reduced current level for a second time period. The maintenance or holding current is reduced in respect of that of a conventional driving current, and in some cases may be an order of magnitude or more less in magnitude than a conventional driving currents thereby resulting in less energy consumed by the SSR.

18 Claims, 18 Drawing Sheets

ENERGY SAVING DRIVING CIRCUIT AND ASSOCIATED METHOD FOR A SOLID STATE RELAY

FIELD OF THE INVENTION

The present invention relates to the field of solid state relays. In particular, the present invention relates to a drive circuit for a solid state relay that provides significant energy savings compared to conventional drive circuits.

BACKGROUND OF THE INVENTION

Solid state relays perform functions similar to electromagnetic relays, but are more reliable, since there are no moving parts. Since the turn on and turn off times of a solid state relay are controllable, the solid state relay also minimizes the generation of switching transients. Solid State Relays (SSRs) with the output stage built on power MOSFETs are easily controllable and are commonly used for general purpose switching of signals and low power AC/DC loads.

Generally, a Solid State Relay (SSR), also known as a photo-MOSFET, includes a light-emitting diode (LED), a photo-sensitive FET driver and high-voltage MOSFETs. The relay turns on (i.e., contact closes) when LED is on. The relay turns off (i.e., contact opens) when LED is off. SSRs are commonly used for general purpose switching of signals and low power AC/DC loads. SSRs also provide both switching and galvanic isolation functions.

Referring to FIG. 1, a functional diagram of a conventional solid state relay (SSR) 100 is shown. The SSR consists of an LED 104, photovoltaic cells 106, turn off circuit 108 and a pair of power MOSFETS Q1, Q2. The two MOSFETs in the SSR 100 are serially connected in reverse together. Therefore, when the SSR 100 is conductive, both of the MOSFETs conduct bi-directionally. When the LED 104 lights up based on a control signal from driving circuit 112, voltage will build up in the photovoltaic cells 106. This voltage is applied between the gates and sources of the MOSFETs. It charges the gate capacitance and turns on the MOSFETs, and the SSR is on. When LED 104 Is off due to the removal of the control signal from the driving circuit 112, the photovoltaic cells 106 stop charging the gate capacitor of the MOSFETs and the internal discharger circuit or turn off circuit 108 is automatically activated, forcing the gates of MOSFETs to discharge. As a result, the gate-source voltage immediately drops and the MOSFETs turn off.

Presently used methods for driving SSRs require a significant amount of energy. This inordinate energy consumption is undesirable and may lead to design difficulties when hundreds of SSRs are used in a design application.

Various embodiments address at least some of these problems.

SUMMARY

An energy saving drive circuit for a solid state relay and associated method are provided.

In some embodiments, an energy saving driving circuit and method are provided for use with a solid state relay (SSR). The circuit and method, according to the disclosure, reduces the overall energy required to drive a solid state relay by maintaining the SSR in an "on" state with a minimal maintenance or holding current after applying a conventional turn-on current. The turn-on current is conventional in that it must be within the well-known range of recommended LED operating currents, which are provided, for example, in SSR datasheets, to ensure that the SSR is turned on within the specific turn-on time. The duration of the turn-on current applied to the LED must be equal or longer than the turn-on time of the SSR. The inventor has recognized that, the maintenance or holding current, however, may be reduced from a conventional driving or turn-on current, e.g., in certain embodiments, at least 50% lower than the turn-on current, and in some cases may be orders of magnitude less than a conventional driving current.

According to one embodiment, an energy saving driving circuit for a solid state relay comprises a turn-on circuit and a current holding circuit. The driving circuit includes a control circuit configured for outputting a control signal, a turn-on circuit configured for providing an output current at a first current level for a first time period in response to the control signal; and a holding circuit configured for maintaining said output current at a second reduced current level for a second time period.

In another embodiment, the turn-on circuit and/or the holding circuit is one of a current source, voltage pulse generator, current pulse generator or voltage converter.

In other embodiments, the energy saving driving circuit may be embodied as a single circuit employing two different current paths in a single sub-circuit.

According to yet another aspect, an energy saving driving circuit for a solid state relay, according to this disclosure, is provided in a single IC package. By packaging the energy saving driving circuit in a single IC package, the driving circuit can be provided as a driver to drive any commercially available SSR on the market.

According to a further embodiment, it is further contemplated to package the energy saving driving circuit together with an SSR into a single IC package to provide an energy saving SSR. The energy saving solid state relay SSR includes a relay circuit configured for closing a contact in an on state and opening the contact in a off state; and an energy conserving driving circuit comprising a control circuit configured for outputting a control signal in response to an input signal to turn on the relay circuit; a turn-on circuit configured for providing an output at a first current level to the relay circuit for a first time period in response to the control signal to turn the relay circuit to the on state; and a holding circuit configured for maintaining said output current at a second reduced current level for a second time period to maintain the relay circuit in the on state.

In still another embodiment, a method for conserving energy in a solid state relay is provided, the method including providing a first output current from a driving circuit at a first current level for a predefined first time period to turn on the sold state relay; and maintaining a second output current from said driving circuit at a reduced second current level for a predefined second time period for maintaining the solid state relay in the on state.

BRIEF DESCRIPTION OF THE DRAWINGS

These and other aspects, features and advantages are described or will become apparent from the following detailed description of some of the preferred embodiments, which is to be read in connection with the accompanying drawings.

In the drawings, wherein like reference numerals denote similar elements throughout the views.

Figure 1:
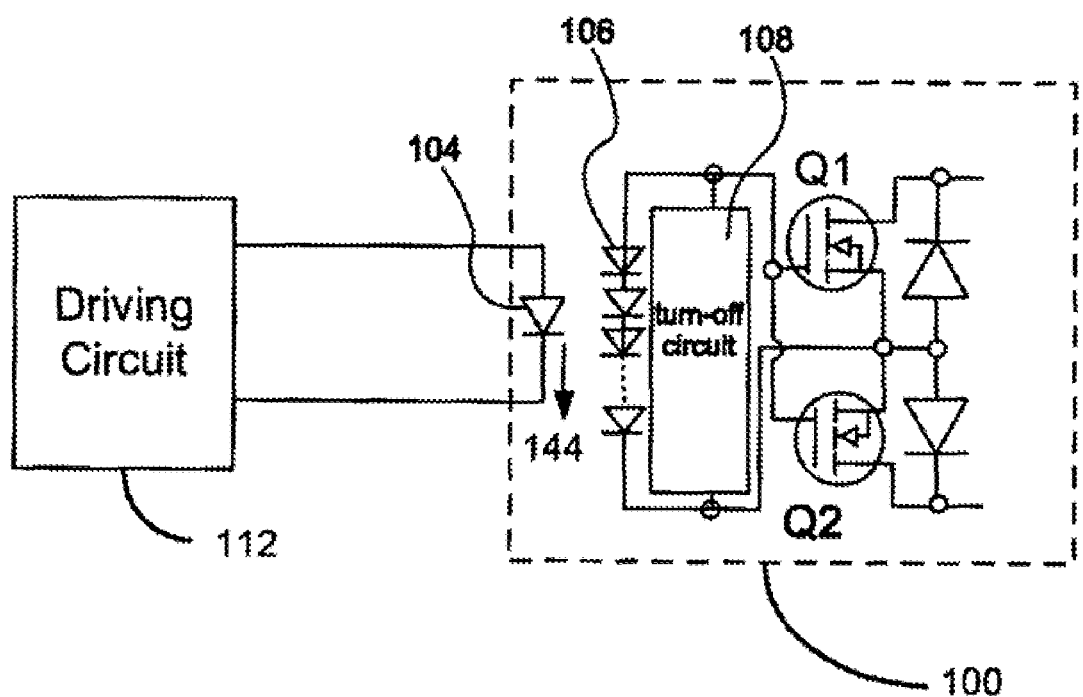
FIG. 1 is a diagram of a solid state relay and driving circuit, according to the prior art.

It is to be understood that the drawings are for purposes of illustrating various concepts, and are not the only possible configurations or embodiments.

DETAILED DESCRIPTIONS OF SOME PREFERRED EMBODIMENTS

Elements shown in the Figures hereof may be implemented in various forms of hardware, software or combinations thereof. Preferably, these elements are implemented in a combination of hardware and software on one or more appropriately programmed general-purpose devices, which may include a processor, memory and input/output interfaces.

The present description illustrates some principles of the present disclosure. It will thus be appreciated by those skilled in the art that certain arrangements and configurations not explicitly disclosed herein will nevertheless embody the principles of the disclosure and fall within the spirit and scope thereof.

All examples and conditional language recited herein are intended to aid the reader in understanding the principles of the disclosure and the concepts contributed by the inventor to furthering the art, and are to be construed as being without limitation to such specifically recited examples and conditions.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing such function including, for example, (a) a combination of circuit elements that performs the same function, or (b) software, including firmware, microcode and the like, combined with appropriate circuitry for executing such software to perform the same function.

1. Overview

Presently, conventional solid state relay (SSR) drive circuits consume a considerable amount of energy. Typically, a drive current for a solid state relay falls within a range of 3 mA to 20 mA. Both the turn-on resistance of the SSR and the turn-on time depend on the drive current. A lower driving current results in a longer turn-on time and a higher turn-on resistance especially at high temperature. As a consequence, more heat is generated in the SSR, which can result in thermal runaway. Conversely, higher driving currents consume more energy and cause design difficulties when utilized in large quantities.

In the described embodiments, the aforementioned problems are overcome by energy saving driving circuits and associated methods for driving a solid state relay. As will become apparent, the energy savings provided by the inventive energy saving driving circuits is significantly less than the energy requirements of conventional driving circuits. For example, the inventor has determined that, for a particular application utilizing an on/off frequency of 100 Hz and a 50% duty cycle, only about 7% of the energy of a conventional drive circuit is required by the energy saving drive circuit of the present disclosure to turn on a solid state relay SSR.

Prior to describing some embodiments, it is instructive to briefly review operating principles of certain solid state relay driving circuits of the prior art.

2. Solid State Relay (SSR) Circuits of the Prior Art

FIG. 1 is a functional view of a conventional Solid State Relay (SSR) circuit 100, sometimes referred to as a photo-MOSFET, according to the prior art. As is well known, the SSR circuit 100 can be considered a type of optically controlled switch for supplying switching and isolation functions. The SSR circuit 100 is operated by a conventional driving circuit 112. As shown, SSR driving circuit 112 is coupled to the SSR circuit 100 for controlling the SSR between switch on and switch off states.

In operation, a driving current is initiated by the SSR driving circuit 112 along path 144 and turns on the LED 104 of the SSR circuit 100. This causes the SSR circuit 100 to turn on as described above. When the driving current is removed, the LED 104 is turned off, which causes the SSR circuit 100 to turn off.

3. Prior Art Driver Circuits
3.1 First Prior Art Driver Circuit

Figure 2:
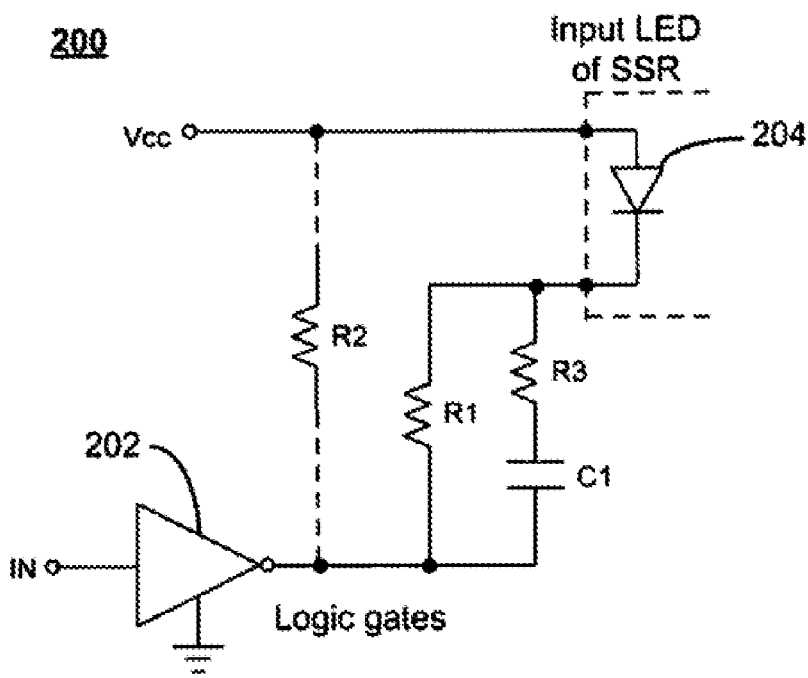
FIG. 2 is a diagram of a driving circuit for a solid state relay, according to the prior art.

FIG. 2 is a schematic circuit diagram illustrating a first conventional driving circuit 200 for an SSR, according to the prior art. In some embodiments, resistor R3 and capacitor C1 are optional elements and may be included (as shown here) to provide a peaking current, such as peaking current 411a of FIG. 4c, described below. For those embodiments that do not include R3 and C1, the driving current waveform is similar to that shown in FIG. 4b. For those embodiments that do include R3 and C1, the driving current waveform is similar to that shown in FIG. 4c.

In operation, when the logic output of the logic gate 202 is high, resistor R2 ensures that the current flowing through the LED 204 is sufficiently small such that the LED Is turned off. With LED off, C1 discharges through R1 and R3. Prior to receiving a second control pulse at the logic gate 202, C1 is completely discharged. When the logic output of the logic gate 202 is low, a surge current flows through the LED 204 until C1 is charged to the level of the voltage across R1. In other words, the voltage across $R1=V_{cc}-V_F-V_{OL}$, where $V_{CC}$ is a supply voltage, $V_F$ is the forward voltage of the LED 204 and $V_{OL}$ is the low level output voltage of the logic gate. Once C1 is fully charged, there is no current flow through the {R3, C1} path. However, current continues flowing through R1.

In the conventional driving circuit 200 of FIG. 2, the current flowing through R1 is determined according to a recommended LED operating current, which can be found, for example, in the SSR datasheets of the SSR being employed. A typical recommended current is between 3 mA to 20 mA and usually 5 mA.

The value of R1 is typically small (e.g., $R1=(V_{cc}-V_F-V_{OL})/I_F$), and is typically less than 1.5 Kohm for a Vcc=5V. R3 is much smaller than R1 to provide peaking current. C1 can be discharged fast through R1 and R3 when LED is off. As a result, it is unnecessary to provide a discharging circuit for C1.

It is instructive to point out that if R1 is chosen to be, for example, 4 kohm or higher, an energy savings can be realized. In other words, the prior art driving circuit 200 of FIG. 2 can be transformed into an energy savings driving circuit by this modification in the resistance value of R1. For a solid state relay (SSR), that is, a photo-MOSFET, only a small current in the LED is needed to make the SSR remain in the "on" state after the SSR is turned-on. As long as R3 and C1 in FIG. 2 are properly chosen to ensure the SSR is turned-on before C1 is fully charged, e.g., in one embodiment, R3=0.3 kohm and C1=1 uF, a larger R1, e.g., 4 kohm, can be chosen to maintain the on state of the SSR. A larger R1 value leads to a smaller holding LED current, the driving current is similar to that shown in FIG. 6. Hence a lower driving energy is consumed.

3.2 Second Prior Art Driver Circuit

Figure 3:
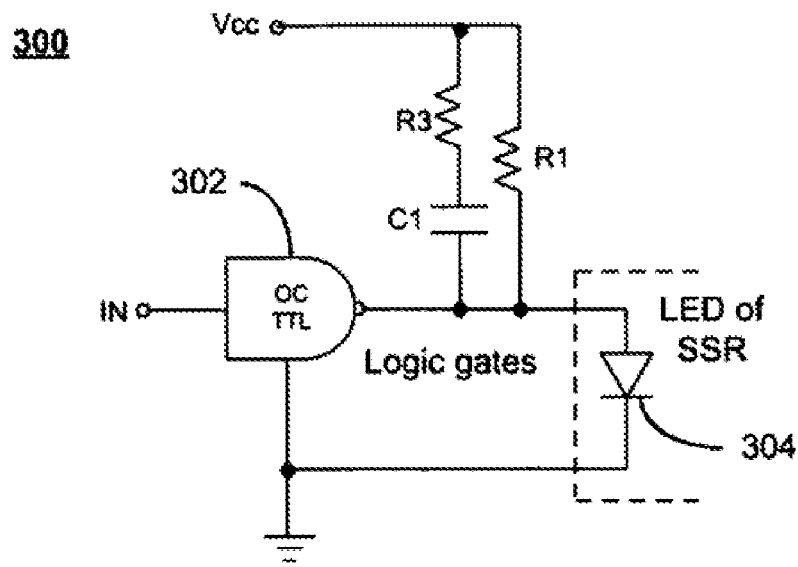
FIG. 3 is a diagram of a driving circuit for a solid state relay, according to the prior art.

FIG. 3 is a schematic circuit diagram illustrating a second conventional driving circuit 300 for an SSR, according to the prior art. In FIG. 3, an open collector TTL 302 is used to drive the LED 304 of the SSR. When the logic output goes low on open collector TTL 302, current is shunted away from the LED 304, and the SSR turns off. When the logic output goes high on open collector TTL 302, a voltage Vcc is applied to the LED through R1, R3 and C1. A surge current flows through the LED until C1 is charged to the voltage across R1 (e.g., $V_{cc}-V_F$), where $V_F$ is the forward voltage of the LED.

Once C1 is fully charged, there is no longer a current flow through the {R3, C1} branch. However, current continues to flow through R1.

For a solid state relay (SSR), that is, a photo-MOSFET, only a small current in the LED is needed to make the SSR remain in the "on" state after the SSR is turned-on. As long as R3 and C1 in FIG. 2 are property chosen to ensure the SSR is turned-on before C1 is fully charged, e.g., in one embodiment, R3=0.3 kohm and C1=1 uF, a larger R1, e.g., 4 kohm, can be chosen to maintain the on state of the SSR. A larger R1 value leads to a smaller LED current, the driving current is similar to that shown in FIG. 6. Hence a lower driving energy is consumed.

4. Driver Circuit—Voltage and Current Waveforms

Figure 4A:
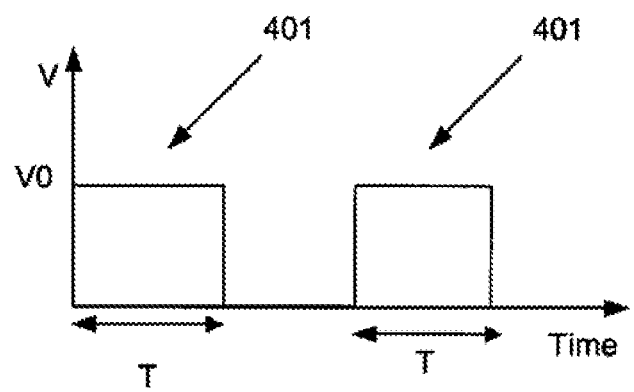
FIG. 4a is a voltage diagram of a control signal for driving a solid state relay and FIGS. 4b and 4C are driving current waveforms according to the prior art.

FIG. 4a illustrates a voltage-time waveform illustrating the magnitude Vo and duration T of a control signal (e.g., a pulse) 401 for use with conventional driving circuits, such as those described above. The control signal (e.g., a pulse) 401 is shown to be periodic.

Referring to FIG. 4a, there is shown a train of control signals (pulses) 401 which are substantially rectangular in shape for controlling an LED of a driving circuit, such as the LEDs illustrated in the SSR circuits of FIGS. 2 and 3. It is understood by those knowledgeable in the art that in the absence of a control signal (pulse) 401, no current flows through the LED and the LED immediately turns off, which causes the SSR to turn off. In a typical application, the control signal (pulse) 401 turns the LED off and on at some predetermined frequency and duty cycle (e.g., 100 KHz and 50% duty cycle). It should be appreciated that, in different embodiments, the control signal (pulse) 401 can be any shape in addition to being rectangular. For example, the control pulse can be a sine-waveform or a cosine waveform, and so on.

Figure 4B:
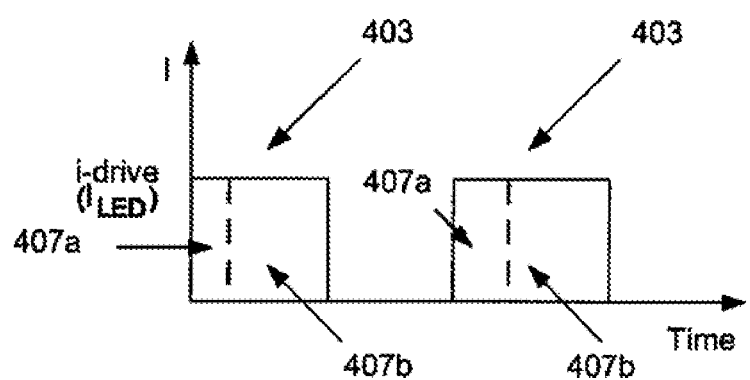
Figure 4C:
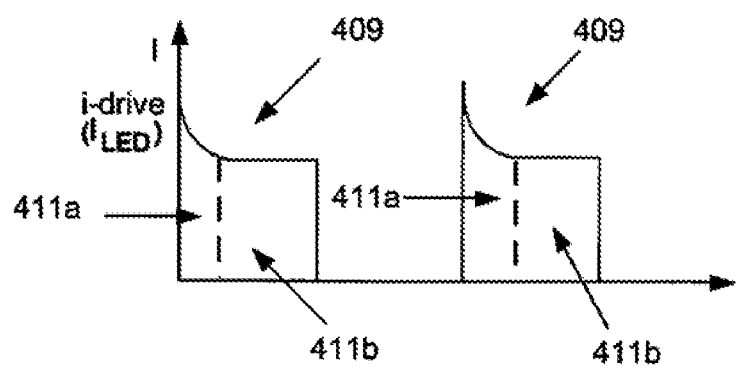

Referring now to FIG. 4b there is shown a conventional driving current waveform that flows through the LED in response to the driving circuit 112 being initiated (activated) by the control signal (pulse) train 401 of FIG. 4a. In the example shown in FIG. 4b, the conventional driving current 403 is shown to be rectangular in shape and comprised of two parts, a turn-on current component 407a and a holding current component 407b.

Application of a driving current for turning on an LED of an SSR can be considered as being comprised of two stages. During a first stage, referred to herein as a "turn-on" stage, the SSR switches from an "off" state to an "on" state. During this first stage, the turn-on current 407a, referred to above, is applied to the LED of an SSR. During a second "holding" stage, to maintain the SSR 100 in the "on" state, current must be continuously supplied to the LED via the holding current component 407b of the driving current 403, as discussed above.

In FIG. 4b, by way of example, the "turn-on" stage occurs for approximately 0.2 ms, followed by the "holding" stage, which occurs for approximately 9.8 ms. (Here, it is assumed the maximum turn-on time of the SSR is 0.2 ms). It is noted that the turn-on current 407a, and holding current 407b are identical in magnitude in the conventional driving method.

In some prior art embodiments, the holding current 411b is slightly less than the turn-on current 411a. This is shown, by way of example, in FIG. 4c, which illustrates a conventional driving current 409 where the turn-on current 411a is greater than the holding current 411b. In this case, the turn-on current 411a is referred to as a "peaking" current. As is well known, the purpose of the peaking current 411a is to shorten the turn-on time of the SSR, since a larger peaking current leads to a shorter turn-on time in a SSR. However, a relatively large holding current 411b is still required.

For simplicity, an operational example will be described in relation to FIG. 4b. Assuming that $V_{cc}$=5V, and $I_{LED}$=5 mA for 403 in FIG. 4b, T=10 ms and turn-on time is 0.2 ms. The energy consumption during time T=10 ms in FIG. 4b is $$V_{cc}\ TI_{LED}=10\ ms*5\ mA*5V=0.25\ mJ$$

Thus, energy consumption is 0.25 mJ.

As will become apparent, the energy saving method provides a considerable energy savings over the prior art approach during the "holding" stage. After the turn-on current 407a is applied to the LED, during the "turn-on" stage, the SSR is turned-on. A key to the energy savings method is realized during the "holding" stage, during which a much smaller holding current is required as compared to conventional holding currents. For example, in accordance with the energy saving method, 0.4 mA is sufficient to maintain (hold) the SSR in the "on" state. In other words, the prior art holding current 407b can be reduced from 5 mA to 0.4 mA. The resulting energy consumption during a time T=10 ms is now:

$$[0.2\ ms*5\ mA*5V]+[9.8\ ms*0.4\ mA*5V]=0.0246\ mJ.$$

It can be seen that a significant amount of energy can be saved by using the energy saving method presented herein.

It should be noted that in the inventive driving circuits of the described embodiments, the duration of the "turn-on" current should be equal or bigger than the maximum turn-on time of a SSR to ensure that the SSR to be turned on. However, it should also be noted that to realize an energy savings, the duration of the "turn-on" current can be much smaller than the duration of the control signal (pulse) train 401 of FIG. 4a.

5. Energy Saving Driving Circuit Types

An energy saving driving circuit of the present disclosure can be derived in a number of different ways. For example, such a circuit can be derived by appropriately modifying a conventional peaking driving circuit, in the manner described above (i.e., by modifying existing circuit element values). In addition to this approach, an energy saving driving circuit can also be derived using one or more of the following approaches—

- By connecting/disconnecting a few sub-circuits having different impedance with respect to an LED circuit.
- By applying two voltage sources to the LED at proper timing.
- By applying two current sources to the LED at proper timing.
- By a combination of all of the previous approaches.

These methods are described as follows.

5.1 First Embodiment

Figure 5:
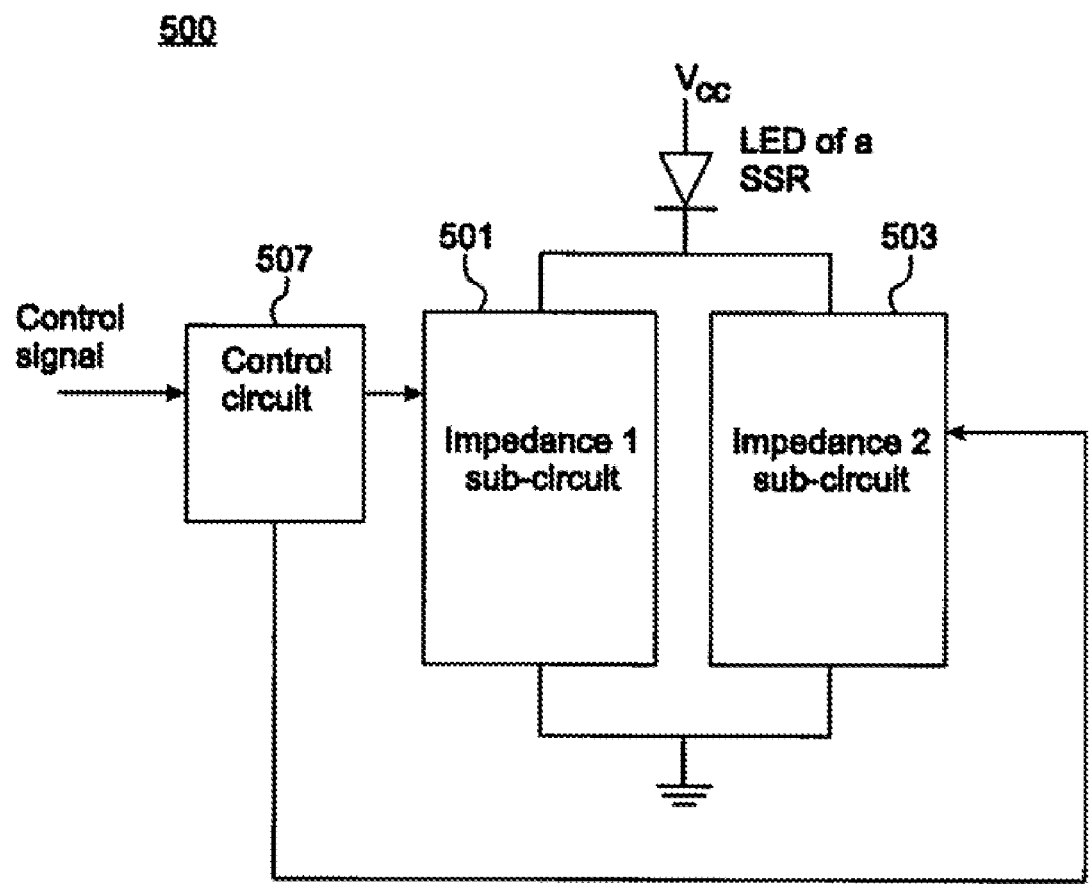
FIG. 5 is a circuit block diagram of a driving circuit of a solid state relay in accordance with an embodiment of the present disclosure.

FIG. 5 illustrates an exemplary driving current circuit 500) according to one embodiment. In accordance with the present embodiment, selected circuit branches of a driving circuit are connected or disconnected at appropriate intervals to achieve an energy savings over conventional driving circuits. Each branch having a different impedance. By removing a selected branch at an appropriate time, the LED is maintained in an "on" state, while requiring less current than is supplied in a conventional driving circuit.

Circuit Configuration

Referring now to FIG. 5 each of the two sub-circuits 501, 503 have different impedances. When connected to the LED, they each form current loops with the LED. One of the sub-circuits, 501 (503), is used to generate the turn-on current and the other sub-circuit 503 (501) is used to generate the holding current. To allow the turn-on current to be much higher than the holding current, the resistance in one of the sub-circuits 501, 503 should be much smaller than the resistance in the other sub-circuit. The control circuit 507 controls the timing associated with the turn-on current flow through one of the sub-circuits 501 (503), and the holding current flow through the other sub-circuit 503 (501). It is understood that the control circuit 507 can be any type of transistor, logic gate, microprocessor, controller, or other device which is configured to electrically open and close as controlled by its input signal.

In addition to the turn-on current being much higher than the holding current in one of the sub-circuits 501 or 503, it should be recognized that the duration of the turn-on current is much smaller than the duration of the lower holding current. The duration of the current flows through each of the sub-circuits 501, 503 can be defined by the charging time of a RC circuit or an RLC circuit. In the present example, at least one of the sub-circuits 501, 503 includes at least one capacitor. In other embodiments, described below, the duration of the current flows through the respective sub-circuits 501, 503 can also be defined by the control circuit 507. In these other embodiments, a microcontroller, microprocessor, memory circuit, delay circuits, flip-flop, register, counter, timing device or any type of transistor or logic gate may be used to define the timing and duration of the current flows through the respective sub-circuits.

Those skilled in the art will now understand that the sub-circuits may be connected and disconnected to an SSR circuit to drive an LED of the SSR circuit in more than one way. By way of example, two methods are discussed below with respect to the driving current circuit 500 of FIG. 5.

A. First Embodiment (Sub-Circuit)

Figure 6A:
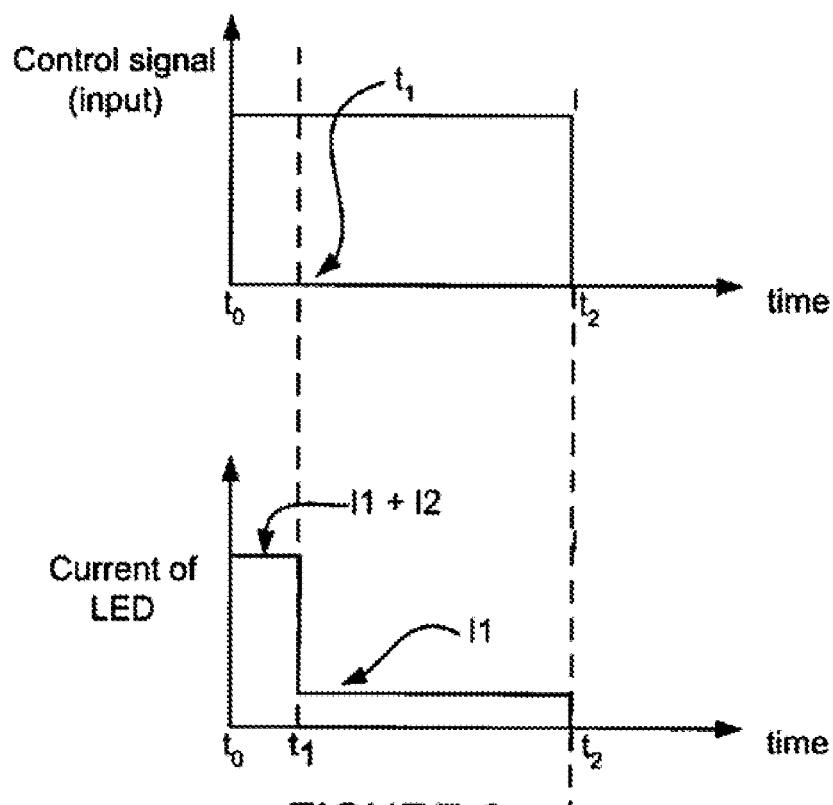
FIGS. 6a and 6b are timing diagrams of the driving circuit of FIG. 5 in accordance with an embodiment of the present disclosure.

A timing diagram for describing this process is shown in FIG. 6a.

The resistance of sub-circuit 501 is R1 and the resistance of the sub-circuit 503 is R2. It is assumed that R1 is much larger than R2.

In operation—

At time t0:—a control signal is applied to the control circuit with both sub-circuit 503 and sub-circuit 501 connected to the LED by the control circuit. The current flowing through the LED is $I_1+I_2$, where $I_1$ represents the current flowing through sub-circuit 501 and $I_2$ represents the current flowing through sub-circuit 503. The current $I_2$ is much larger than the current $I_1$ because resistance of sub-circuit 501 is much larger than the resistance of sub-circuit 503.

At time t1:—Sub-circuit 503 disconnects from LED circuit. At this point, the current flowing through the LED is only $I_1$.

At time t2:—The control signal is removed. Sub-circuit 501 is then disconnected from the LED. There is no current flow through the LED and the LED turns off.

B. Second Embodiment

Figure 6B:
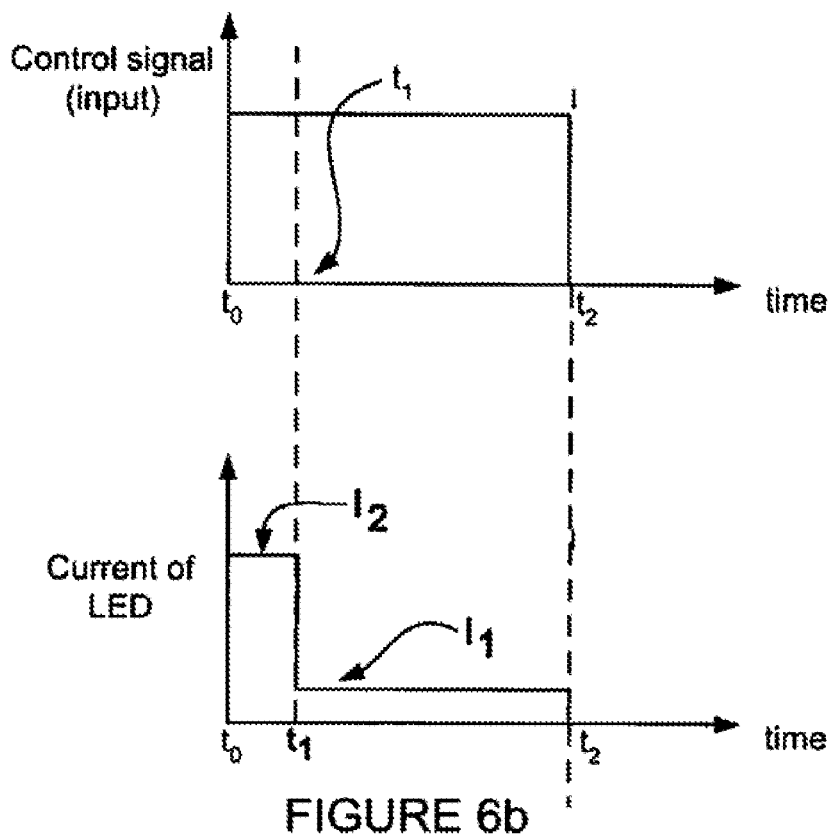

A timing diagram for describing this process is shown in FIG. 6b.

The resistance of sub-circuit 501 is R1 and the resistance of the sub-circuit 503 is R2. It is assumed that R1 is much larger than R2.

In operation—

At time t0:—A control signal is applied to the control circuit with sub-circuit 503 connected to the LED by the control circuit. The current flowing through the LED and sub-circuit 503 is $I_2$.

At time t1:—Sub-circuit 503 disconnects from the LED circuit and sub-circuit 501 is connected to the LED. At this point, the current flowing through the LED and sub-circuit 501 is $I_1$. The current $I_2$ is much larger than $I_1$ because resistance of sub-circuit 501 is much larger than resistance of sub-circuit 503.

At time t2:—The control signal is removed. Sub-circuit 501 is then disconnected from the LED. There is no current flow through the LED and the LED turns off.

5.2 Second Embodiment (Sub-Circuit)

Figure 7:
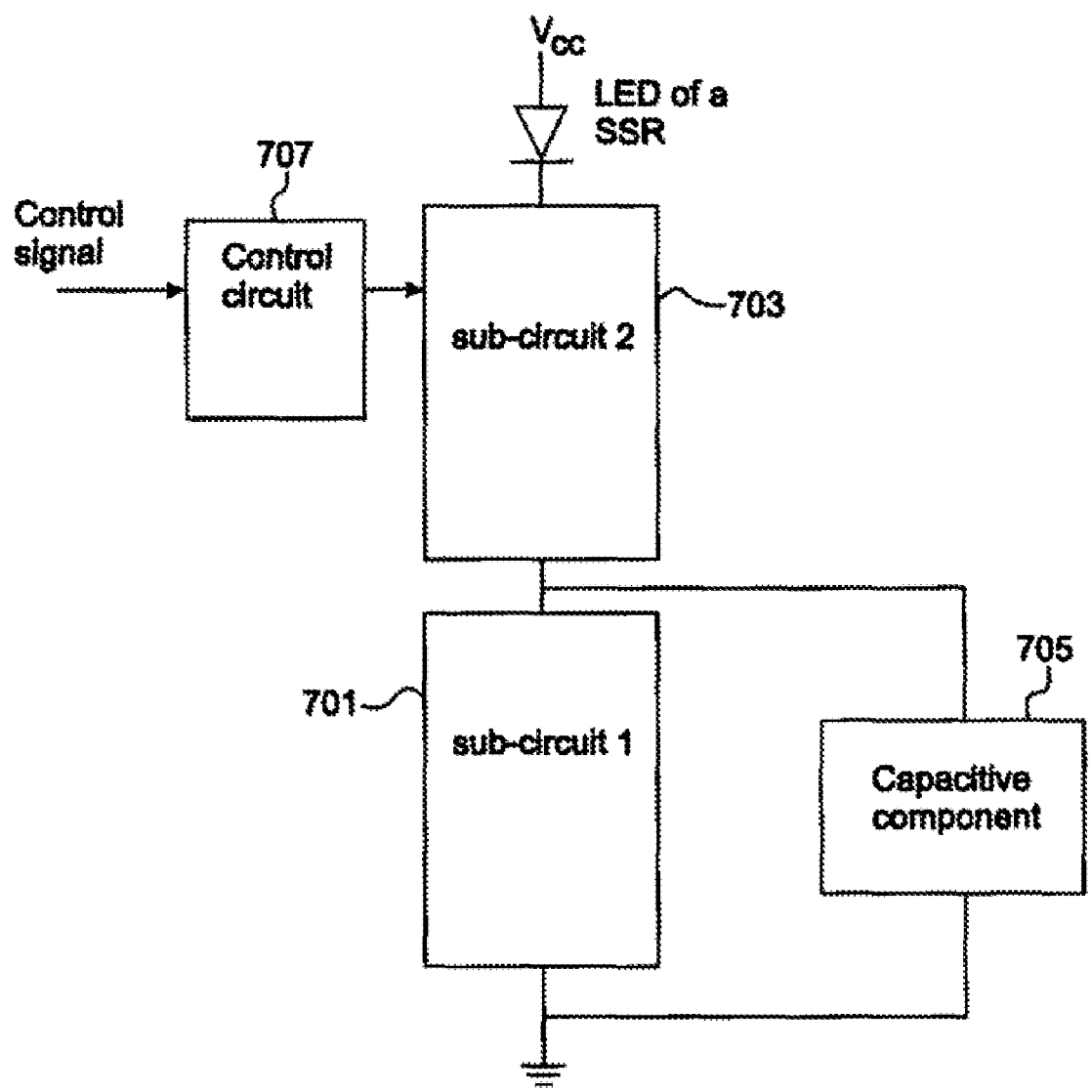
FIG. 7 is a circuit block diagram of a driving circuit in accordance with an embodiment of the present disclosure.

FIG. 7 illustrates an exemplary driving current circuit 700, according to one embodiment. In accordance with the present embodiment, selected circuit branches of a driving circuit are connected or disconnected at appropriate intervals to achieve an energy savings over conventional driving circuits. Each branch having a different impedance with respect to an LED of an SSR circuit. By removing a selected branch at an appropriate time, the LED is maintained in an "on" state, while requiring less current than is supplied in a conventional driving circuit.

Circuit Configuration

Referring now to FIG. 7, each of the two sub-circuits 701, 703 have different impedances. When connected to the LED, they each form current loops with the LED. One of the sub-circuits, 701 (703), is used to generate the turn-on current and the other sub-circuit 703 (701) is used to generate the holding current. To allow the turn-on current to be much higher than the holding current, the resistance in one of the sub-circuits 701, 703 should be much smaller than the resistance in the other sub-circuit. A control circuit 707 controls the timing associated with the current flows through each of the sub-circuits 701, (703). It is understood that the control circuit 707 can be any type of transistor, logic gate, microprocessor, controller, or other device which is configured to electrically open and close as controlled by its input signal. The duration of the current flows through the sub-circuits 701, 703 can be defined by the charging time of an RC circuit, or RLC circuit. In this case, at least one of the sub-circuits 701, 703 has one capacitive component 705 in parallel with a resistive component.

Circuit Operation

Figure 8:
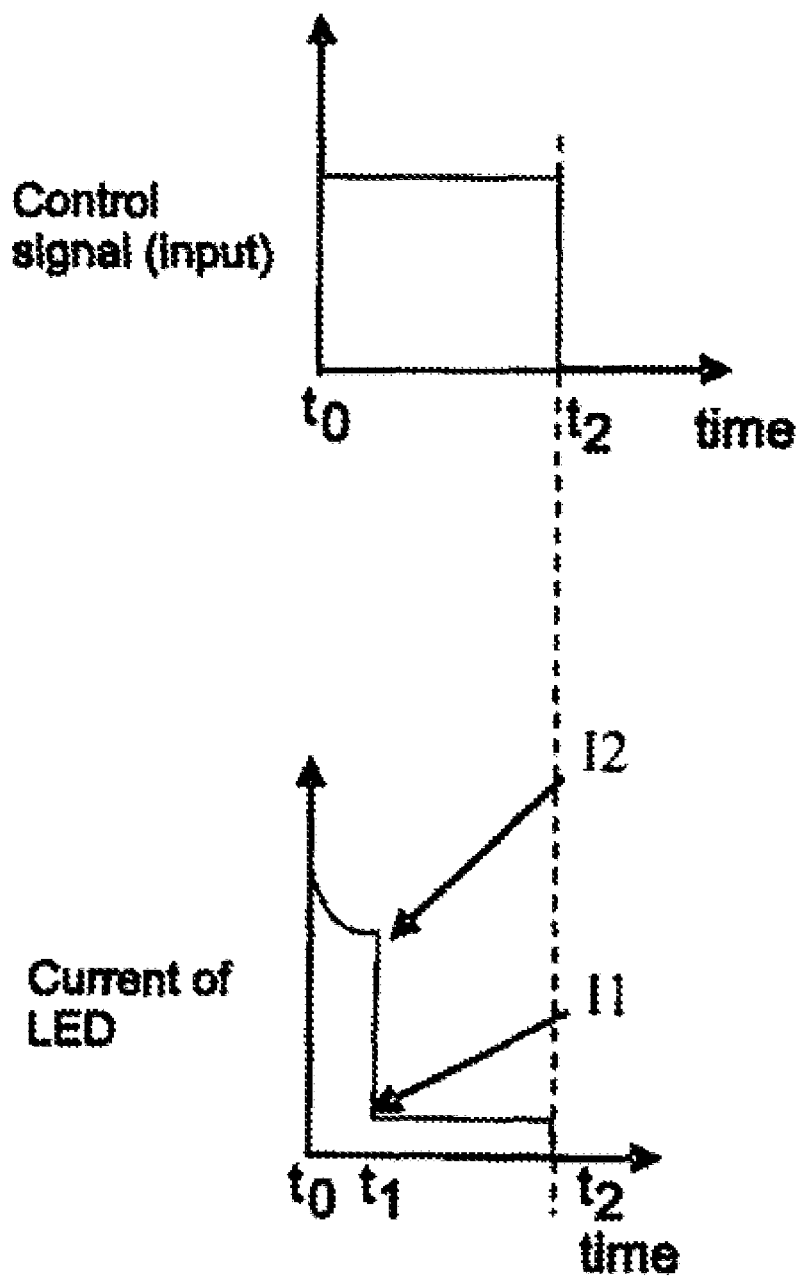
FIG. 8 is a timing diagram of the driving circuit of FIG. 7 in accordance with an embodiment of the present disclosure.

A timing diagram for describing this process is shown in FIG. 8.

Assume the resistance of sub-circuit 701 is R1 and the resistance of the sub-circuit 703 is R2 and that the resistance R1 is much larger than the resistance R2.

In operation—

At time t0:—A control signal is applied to the control circuit with sub-circuit 703 connected to the LED by the control circuit. The current flowing through the LED and sub-circuit 703 is $I_2$.

At time t1:—Both sub-circuit 703 and sub-circuit 701 are connected to the LED. The current flowing through the LED, sub-circuit 703 and sub-circuit 701 is $I_1$. The current $I_2$ is much larger than $I_1$ because the resistance R1 of sub-circuit 701 is much larger than the resistance R2 of sub-circuit 703.

It is also possible that sub-circuit 701 is connected to the LED and R2 is shunted away. At this point, the current flowing through the LED and sub-circuit 701 is $I_1$. The current $I_2$ is much larger than $I_1$ because sub-circuit 701 R1 is much larger than sub-circuit 703.

At time t2:—The control signal is removed. Both sub-circuit 701 and sub-circuit 703 are disconnected from the LED. There is no current flow through the LED and the LED turns off.

5.3 Third Embodiment (Voltage Converter)

Figure 9A:
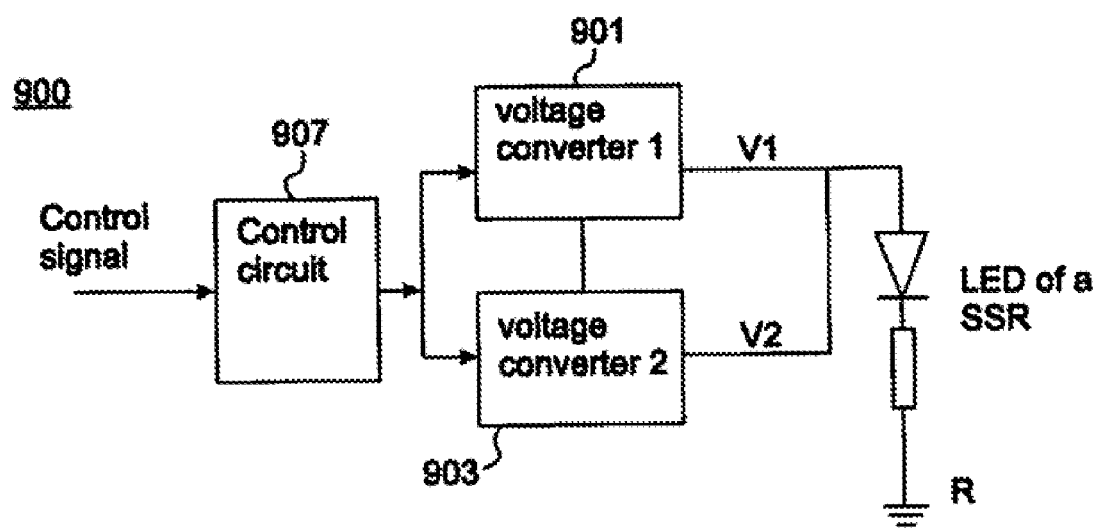
FIG. 9a is a circuit block diagram of a driving circuit in accordance with an embodiment of the present disclosure.

FIG. 9a illustrates an exemplary driving current circuit 900, according to one embodiment. In accordance with the present embodiment, voltage converters translate the amplitude of an input voltage or the amplitude of a supply voltage to another value, for example, 5V to 3V. It is understood that the translated voltage is not related in any way to the logic level.

Figure 9B:
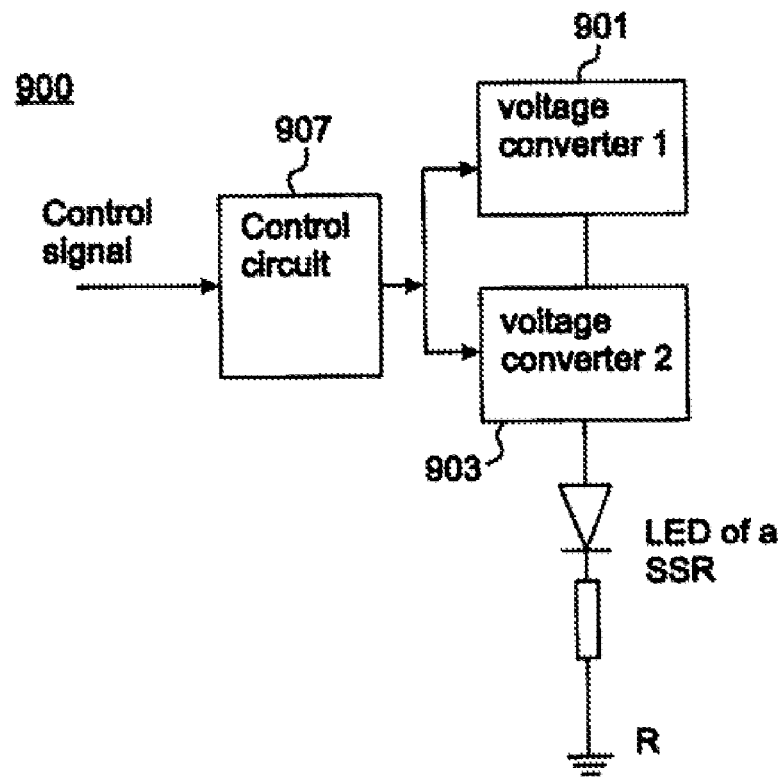
FIG. 9b is a circuit block diagram of a driving circuit in accordance with an embodiment of the present disclosure.

FIG. 9b shows a simple modification of the driving current circuit 900 of FIG. 9a. The circuits of FIGS. 9a and 9b operate according to a similar principle. In FIG. 9a, the voltage converters 901 and 903 are in parallel, but in FIG. 9b the voltage converters 901 and 903 are in series. As a result, in the driving current circuit of FIG. 9b, both the voltage converters 901 and 903 can be connected to LED at the same time to provide a higher driving current.

Circuit Operation

Figure 10:
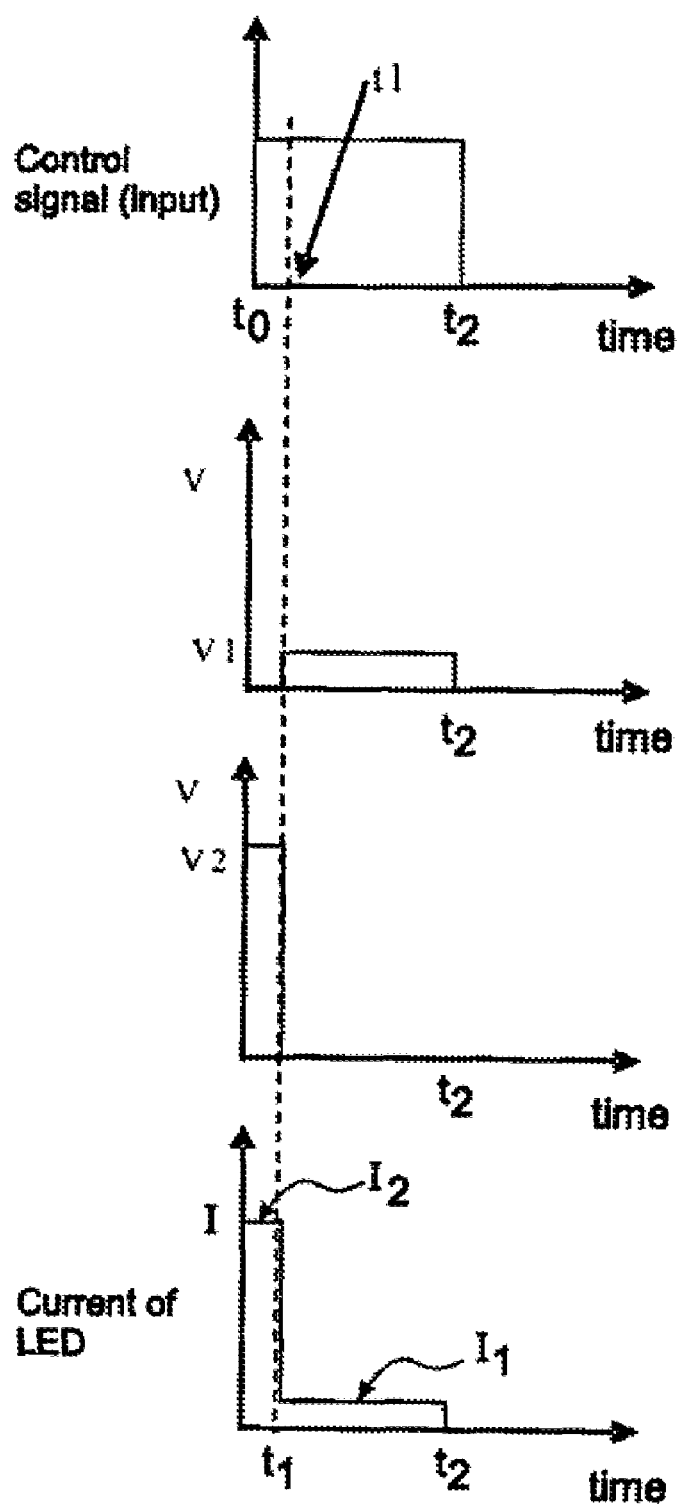
FIG. 10 is a timing diagram of the driving circuits of FIGS. 9a and 9b in accordance with an embodiment of the present disclosure.

FIG. 10 is a timing diagram describing the operation of the driving circuit shown in FIG. 9a. The operation of the driving circuit shown in FIG. 9b is similar to the timing diagram of FIG. 10.

Assume the output voltage of voltage converter 1 901 is V1 and the output voltage of voltage converter 2 903 is V2. Further assume V2 is much larger than V1.

In operation—

At time t0:—A control signal is applied to the control circuit with voltage converter 2 903 connected to the LED by the control circuit 907. The current flowing through the LED is $I_2$. The current flow being determined by V2 (the output voltage of Voltage converter 2 903), $V_F$ and R.

At time t1:—Voltage converter 1 901 is connected to the LED and voltage converter 2 903 is disconnected from the LED. The current flowing through the LED is $I_1$ with $I_1$ being much smaller than $I_2$ because the output voltage V2 Is much larger than the output voltage V1.

At time t2:—The control signal is removed. Voltage converter 1 901 is disconnected from the LED and the LED turns off.

5.4 Fourth Embodiment (Voltage Pulse Generator)

Figure 11A:
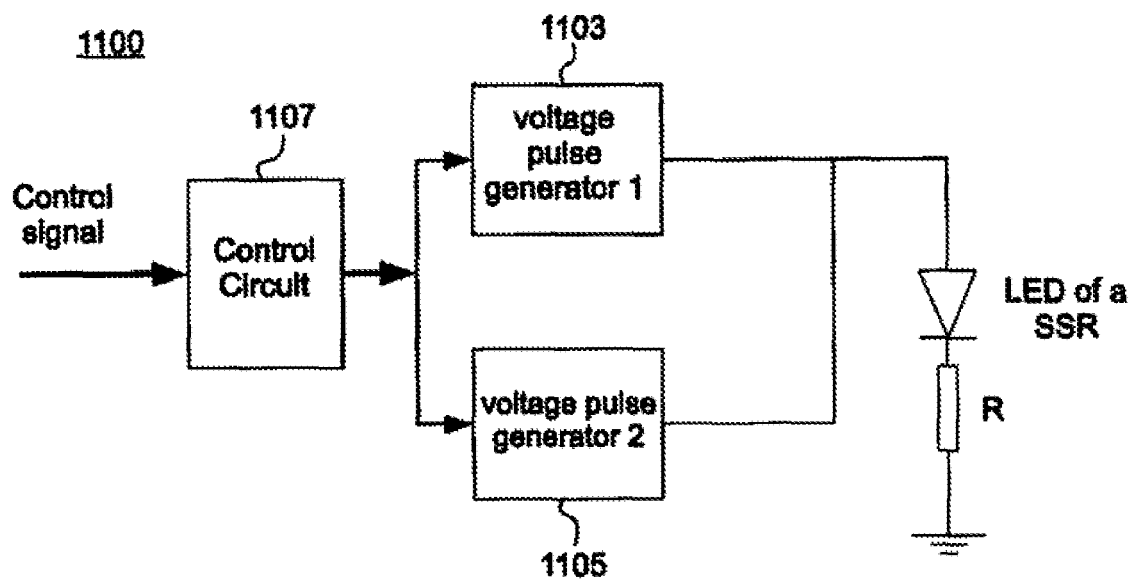
FIG. 11a is a circuit block diagram of a driving circuit in accordance with an embodiment of the present disclosure.

FIG. 11a illustrates an exemplary driving current circuit 1100, according to one embodiment. In accordance with the present embodiment, voltage pulse generators 1103, 1105 amplify an output pulse of a control circuit 1107 in accordance with a predetermined amplification level.

Figure 11B:
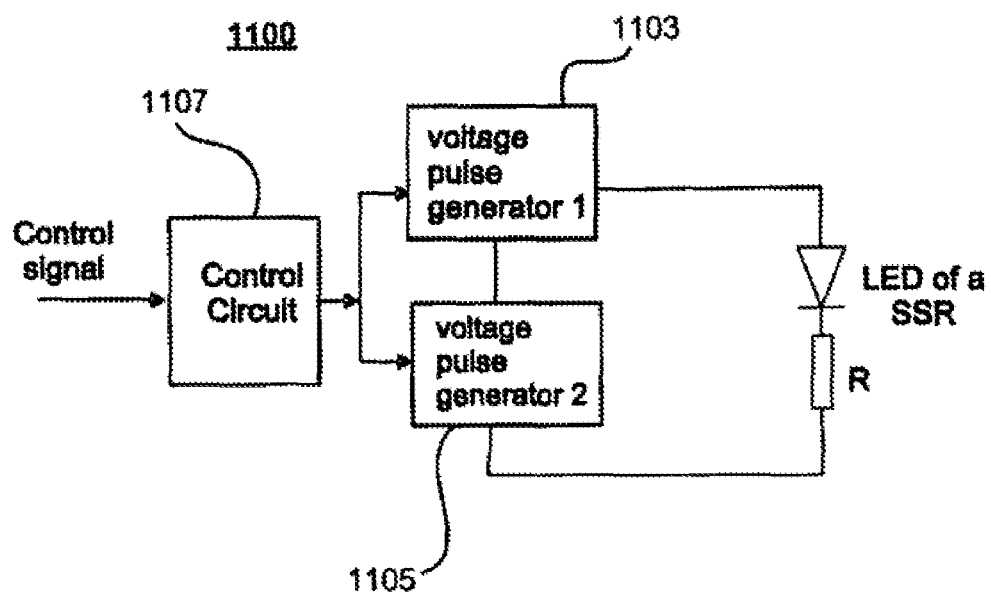
FIG. 11b is a circuit block diagram of a driving circuit in accordance with an embodiment of the present disclosure.

FIG. 11b illustrates a simple modification of FIG. 11a which operates on a similar principle to the circuit shown in FIG. 11a. In FIG. 11a, the voltage pulse generators 1103 and 1105 are in parallel, but in FIG. 11b the voltage pulse generators 1103 and 1105 are in series. As a result, in the case of FIG. 11b, both the voltage pulse generators 1103 and 105 can be connected to LED at the same time to provide higher driving current.

Circuit Operation

Figure 12:
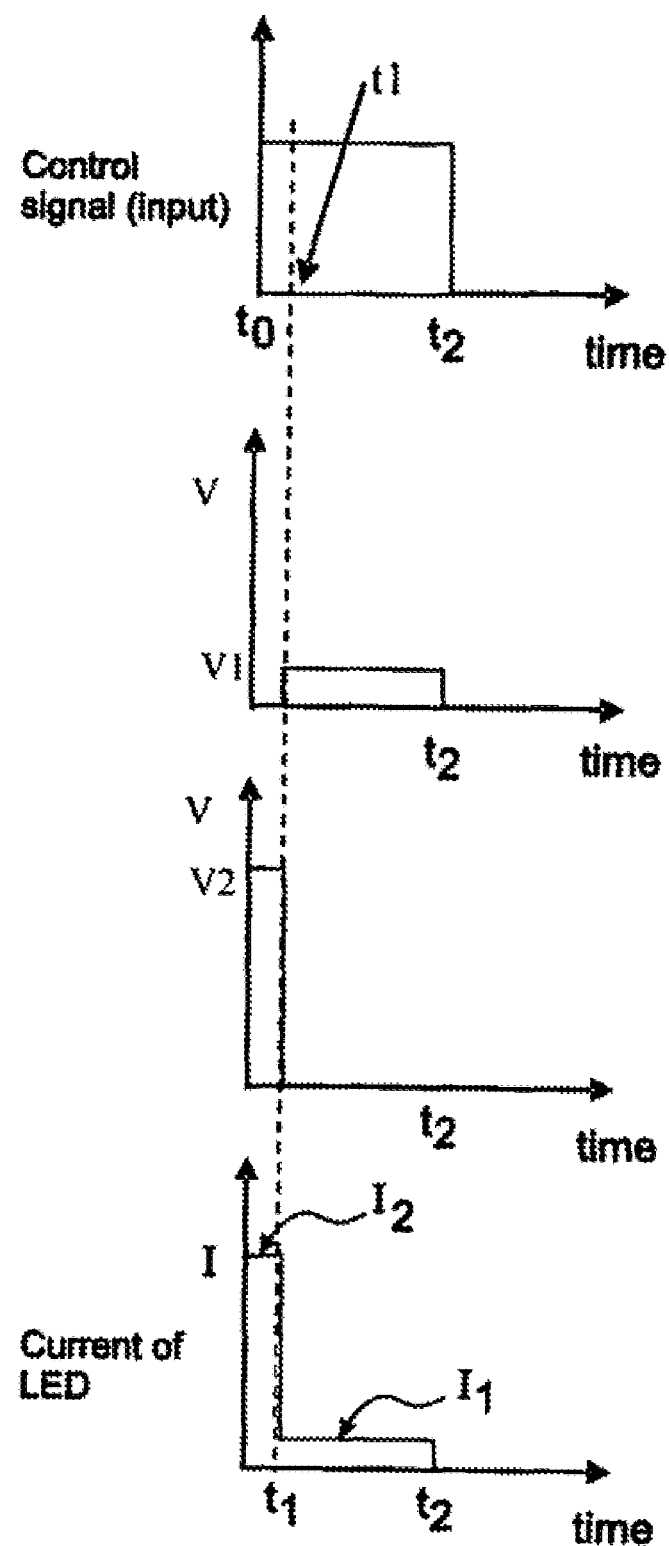
FIG. 12 is a timing diagram of the driving circuits of FIGS. 11a and 11b in accordance with an embodiment of the present disclosure.

A timing diagram describing this process of the driving circuit shown in FIG. 11a is shown in FIG. 12. It is noted that the operation of the driving circuits shown in FIG. 11b result in a similar timing diagram to that shown in FIG. 12.

For example, a first voltage pulse generator 1103 outputs a voltage V1 and a second voltage pulse generator 1105 outputs a voltage V2. V2 is assumed to be much larger than V1.

In operation—

At time t0:—A control signal is applied to the control circuit with the output V2 of the second voltage pulse generator 1105 being applied to the LED. The current flowing through the LED is $I_2$. The current flow being determined by V2 (the output voltage of voltage converter 2 903), $V_F$ and R.

At time t1:—The output of the first pulse generator 1103 is V1 and is supplied to the LED. The output of the second pulse generator 1105 is zero. The current flowing through the LED is $I_1$ with $I_1$ being much smaller than $I_2$ because the output voltage V2 is much larger than the output voltage V1 (zero).

At time t2:—The control signal is removed. The output of the first pulse generator 1103 becomes zero, and there is no current flow through the LED and the LED turns off.

5.5 Fifth Embodiment (Current Source)

Figure 13:
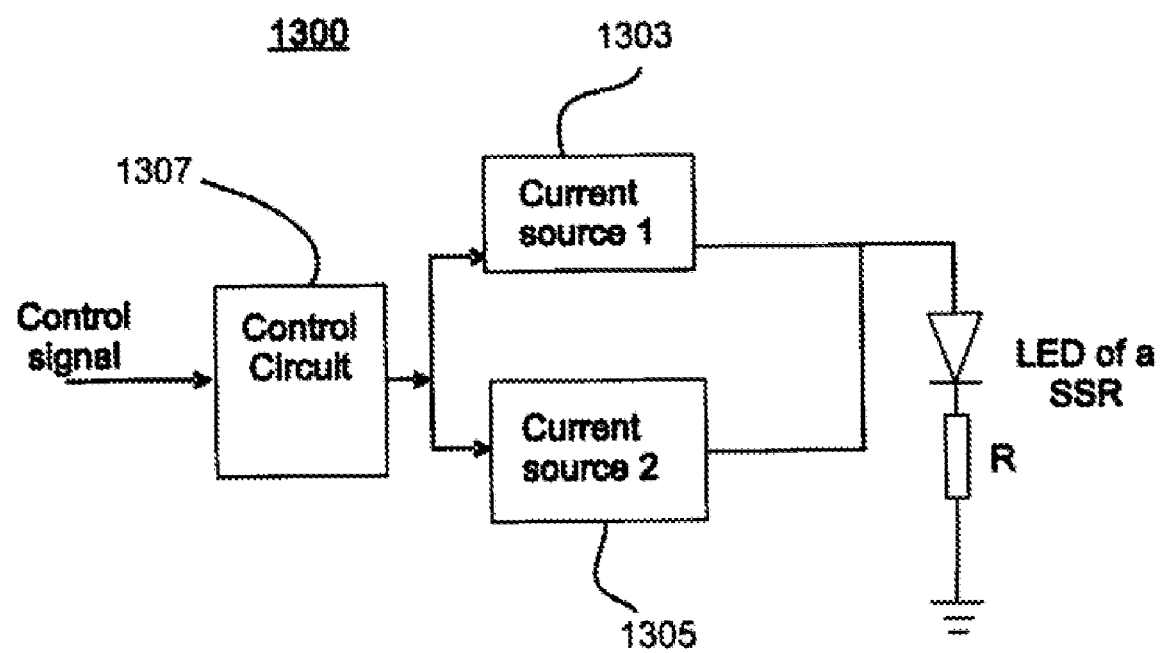
FIG. 13 is a circuit block diagram of a driving circuit in accordance with an embodiment of the present disclosure.

FIG. 13 illustrates an exemplary driving current circuit 1300, according to one embodiment. In accordance with the present embodiment, current sources supply current to an LED upon being activated by a control circuit 1307. For example, a first current source 1303 outputs a current I1 upon being activated by the control circuit 1307 and a second current source 1305 outputs a current I2 upon being activated by the control circuit 1307. Current I2 is assumed to be much larger than current I1. It is understood that the current sources can be a current mirror, an equivalent current source of any voltage source circuit, or any circuit which supplies a current as an output. The control circuit 1307 controls both the timing and duration of the output currents of the respective current sources 1303, 1305. The duration of the lower current I1 is much greater than the duration of the higher current I2. Timing is controlled in control circuit 1307 via microprocessor, microcontroller, counter, memory, timer, delay circuit, register, or circuits incorporated within an RC network or RL network. The RC or RL network may include R, L, C and other components.

In operation—

Figure 14:
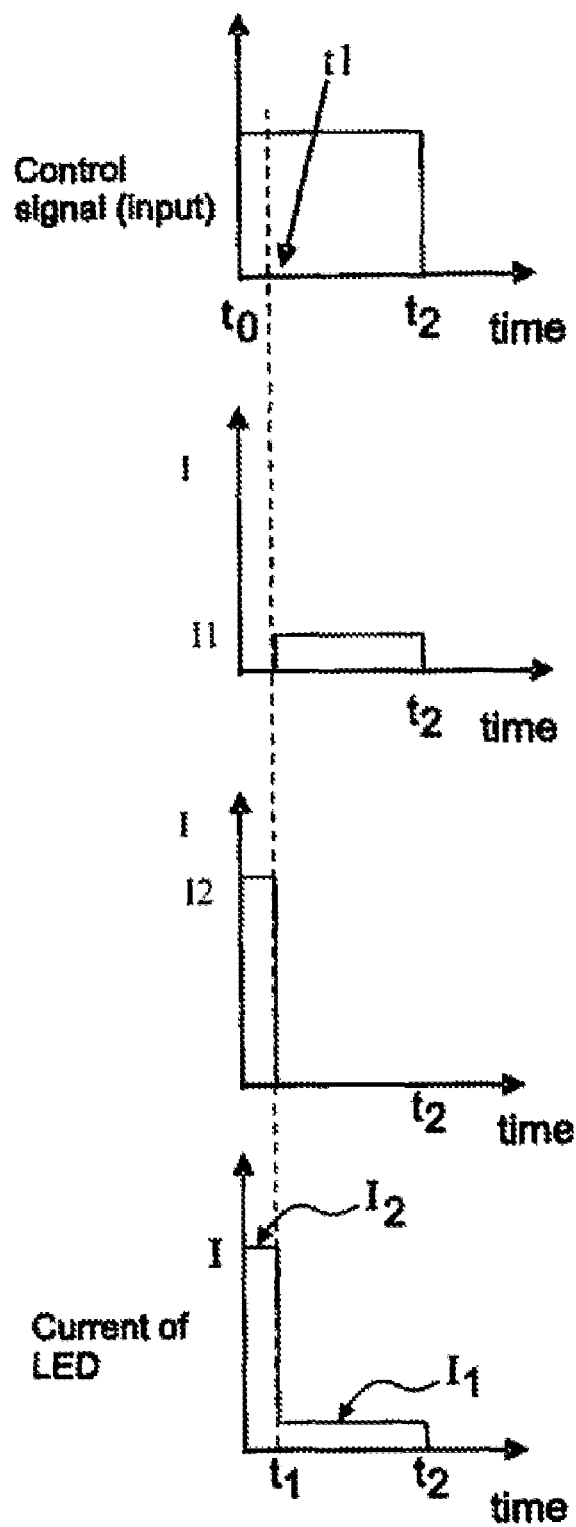
FIG. 14 is a timing diagram of the driving circuit of FIG. 13 in accordance with an embodiment of the present disclosure.

A timing diagram describing this process is shown in FIG. 14.

At time t0:—A control signal is applied to the control circuit. The control circuit connects the second current source 1305 to the LED, with the output I2 of the second current source 1305 being applied to the LED.

At time t1:—The first current source 1303 is connected to the LED via the control circuit 1307. The control circuit 1307 also disconnects the second current source 1305 from the circuit. The current flowing through the LED is only $I_1$.

At time t2:—The control signal is removed. The output of the first current source 1303 becomes zero, and there is no current flow through the LED and the LED turns off.

5.6 Sixth Embodiment (Current Pulse Generator)

Figure 15:
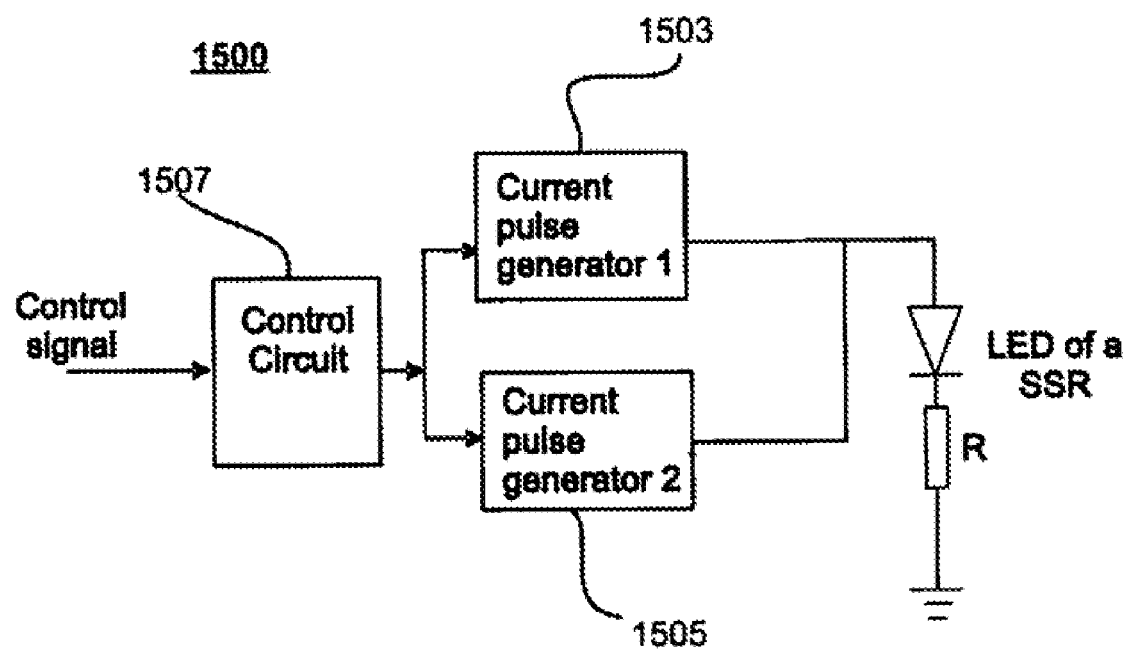
FIG. 15 is a circuit block diagram of a driving circuit in accordance with an embodiment of the present disclosure.

FIG. 15 illustrates an exemplary driving current circuit 1500, according to one embodiment. In accordance with the present embodiment, current pulse generators supply current to an LED upon being activated by a control circuit 1507. For example, a first current pulse generator 1503 outputs a current I1 upon being activated by the control circuit 1507 and a second current pulse generator 1505 outputs a current I2 upon being activated by the control circuit 1507. Current I2 is assumed to be much larger than current I1. The control circuit 1507 controls both the timing and duration of the output currents of the respective current pulse generators 1503, 1505. The duration of the lower current I1 is much greater than the duration of the higher current I2. Timing is controlled in control circuit 1507 via microprocessor, microcontroller, counter, memory, timer, delay circuit, register, or circuits incorporated within an RC network or RL network. The RC or RL network may include R, L, C and other components. It is understood that the current pulse generators can be a current mirror, an equivalent current source of any voltage source circuit, or any circuit which supplies a current as an output.

In operation—

Figure 16:
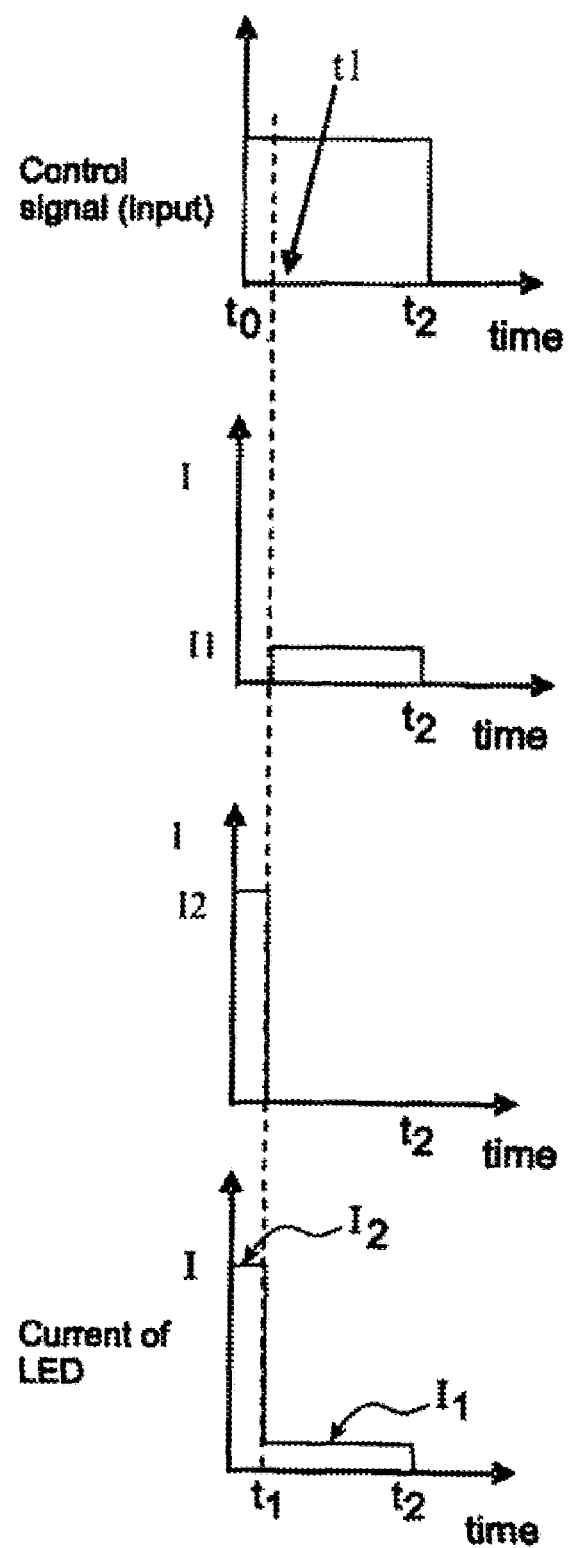
FIG. 16 is a timing diagram of the driving circuit of FIG. 15 in accordance with an embodiment of the present disclosure.

A timing diagram describing this process is shown in FIG. 16.

At time t0:—A control signal is applied to the control circuit. The control circuit connects the second current pulse generator 1505 to the LED, with the output I2 of the second pulse generator 1505 being applied to the LED.

At time t1:—The first current pulse generator 1503 is connected to the LED via the control circuit 1507. The control circuit 1507 also disconnects the second current pulse generator 1505 from the circuit. The current flowing through the LED is $I_1$.

At time t2:—The control signal is removed. The output of the first current pulse generator 1503 becomes zero, and there is no current flow through the LED and the LED turns off.

The following two embodiments provide more detailed examples of an energy saving driving circuit.

5.7 Seventh Embodiment

Figure 17:
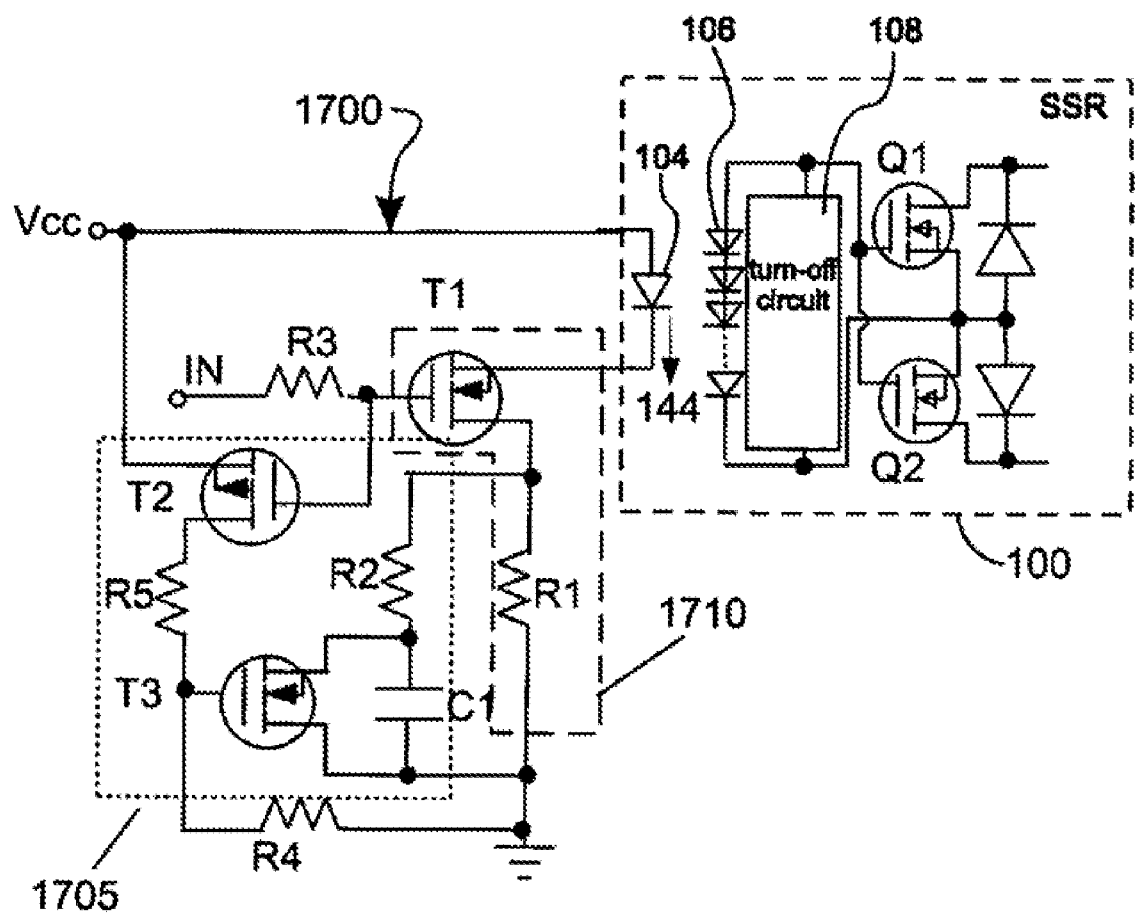
FIG. 17 is a circuit block diagram of a driving circuit in accordance with an embodiment of the present disclosure.

Referring now to FIG. 17, there is shown a circuit diagram of an energy saving driving circuit 1700 for driving an input LED 104 of an SSR 100, according to one embodiment of the present disclosure. The driving circuit is functionally divided into a turn-on circuit 1705 and a current holding circuit 1710.

Turn-On Circuit

Turn-on circuit 1705 includes a pulse shaper circuit and a discharge circuit. The pulse shaper circuit is comprised of C1 and R2. The value of R2 is typically less than 1 Kohm and C1 is determined according to the turn-on time of the SSR 1750 and is typically in the range of 20 uF-0.1 uF. With increasing values of C1, the pulse width of the turn-on current increases along with the power consumption.

The discharge circuit is comprised of three resistors, R3, R4 and R5, a P-channel MOSFET T2 and an N-channel MOSFET T3. R4 provides a discharge path for the gate-source capacitor of N-channel MOSFET T3. R5 is a current limiting resistor. To avoid power waste, resistors R4 and R5 are preferably large, e.g., on the order of 20 Kohm.

The current holding circuit 1710 comprises resistor R1 and N-channel MOSFET T1. Resistor R1 is typically larger than 2 kohm.

In operation, when a positive voltage is applied to the "IN" terminal, T1 is turned on and T2 is turned off. Once T1 is turned on, Vcc charges C1 through the LED and R2. Because R2 is much smaller compared with R1, a larger current flows through the LED. After C1 is fully charged, no further current flows through R2 and C1. At this point, current only flows through the LED and R1. Because resistor R1 is typically large, the resulting current flow through the LED is small.

5.8 Eighth Embodiment

Figure 18:
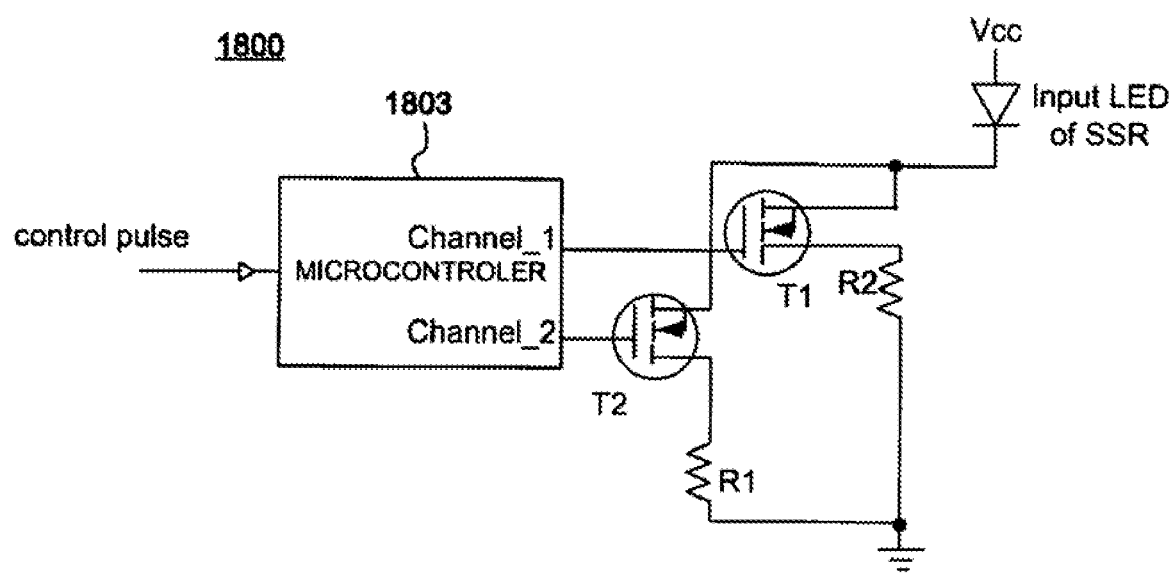
FIG. 18 is a circuit block diagram of a driving circuit in accordance with an embodiment of the present disclosure.

Referring now to FIG. 18, there is shown a circuit diagram of an energy saving driving circuit 1800 for driving an LED of an SSR, according to one embodiment of the present disclosure. In the present embodiment, there is shown a microcontroller 1803 for generating a current driving waveform. However, it is understood, that other embodiments may implement a microprocessor, multivibrator or monvibrator.

In operation, an output pulse is used to control the connection and disconnection of the "turn-on" sub-circuit {T1, R2} or {T2, R1} and the "holding-on" sub-circuit {T1, R2} or {T2, R1}.

5.9 Ninth Embodiment

Figure 19:
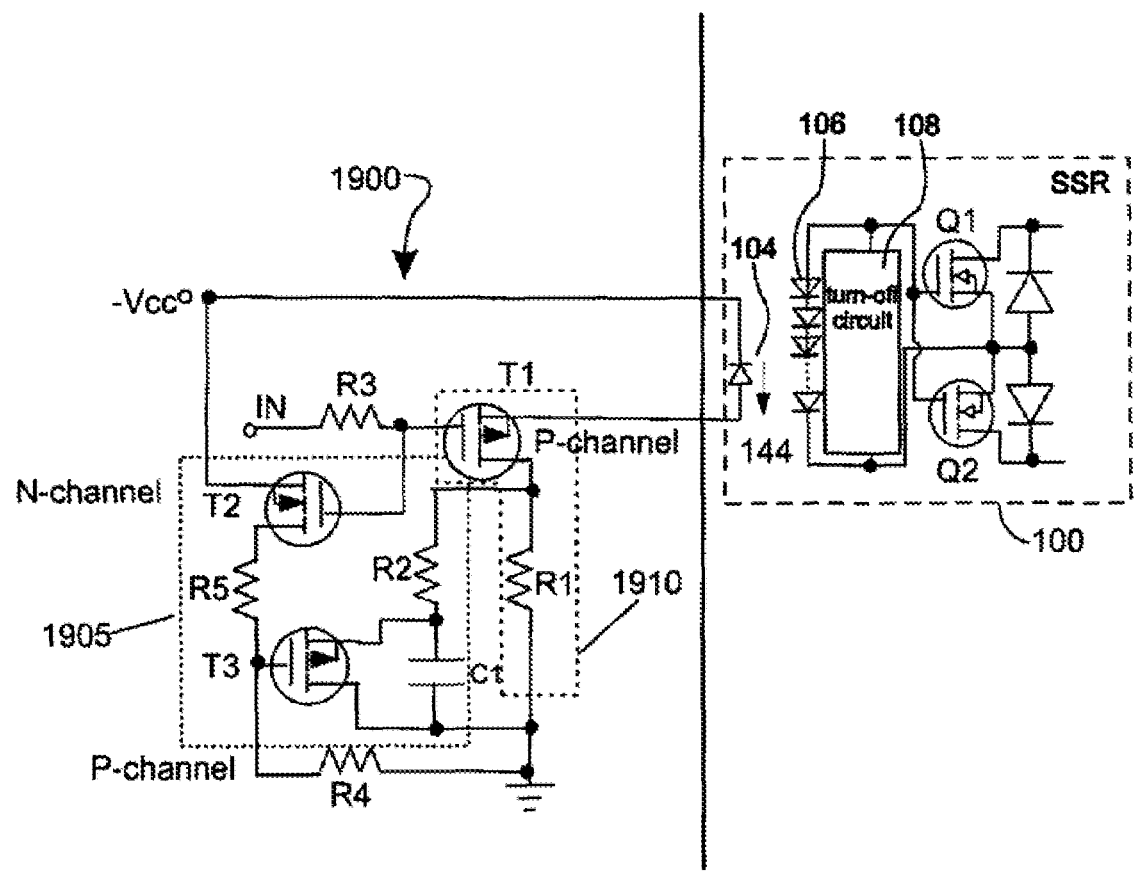
FIG. 19 is a circuit block diagram of a driving circuit in accordance with an embodiment of the present disclosure.

Referring now to FIG. 19, there is shown a circuit diagram of an energy saving driving circuit 1900 for driving an LED of an SSR 100, according to one embodiment of the present disclosure. The circuit diagram of FIG. 19 is functionally comprised of a turn-on circuit 1905 and a current holding circuit 1910. The turn-on circuit includes a pulse shaper and a discharge circuit. The pulse shaper circuit is comprised of a capacitor C1 and a resistor R2. The value of R2 is typically less than 1 Kohm and C1 is determined according to the turn-on time of the SSR and is typically in the range of 20 uF-0.1 uF. With increasing values of C1, the pulse width of the turn-on current increases along with the power consumption.

The discharge circuit consists of three resistors, R3, R4, R5, a N-channel MOSFET T2 and an P-channel MOSFET T3. Resistor R4 provides a discharge path for the gate-source capacitor of P-channel MOSFET T3. Resistor R5 is a current limiting resistor. To avoid power waste, resistors R4 and R5 are preferably large, e.g., on the order of 20 Kohm.

The current holding circuit 1910 comprises a resistor R1 and a P-channel MOSFET T1. Resistor R1 is typically larger than 2 Kohm.

In operation, when a negative voltage is applied to the "IN" terminal, T1 is turned on and T2 is turned off. Once T1 is turned on, Vcc charges C1 through the LED and R2. Because R2 is much smaller compared with R1, a larger current flows through the LED. After C1 is fully charged, no further current flows through R2 and C1. At this point, current only flows through the LED and R1. Because resistor R1 is typically large, the resulting current flow through the LED is small. When a 0V is applied to the "IN" terminal, T1 is turned off and T2 and T3 are turned on. C1 discharges through T3.

Although embodiments which incorporate the teachings of the present disclosure have been shown and described in detail herein, those skilled in the art can readily devise many other varied embodiments that still incorporate these teachings. Having described preferred embodiments for an energy saving driving circuit and associated method for a solid state relay (which are intended to be illustrative and not limiting), it is noted that modifications and variations can be made by persons skilled in the art in light of the above teachings. It is therefore to be understood that changes may be made in the particular embodiments of the disclosure disclosed which are within the scope and spirit of the disclosure as outlined by the appended claims. Having thus described the disclosure with the details and particularity required by the patent laws, what is claimed and desired protected by Letters Patent is set forth in the appended claims.

What is claimed is:

1. A solid state relay, comprising:
  a relay circuit having a maximum turn-on time and comprising a switch, the relay circuit being configured to operate in an on state when the switch is in a first position and to operate in an off state when the switch is in a second position;
  an LED;
  an energy-conserving circuit operably connected to, and configured to drive, the LED, comprising:
    a control circuit configured to output a control signal in response to receiving an input signal, the output signal causing the switch to assume the first position and thereby cause the relay circuit to operate in the on state;
    a turn-on circuit comprising a first resistor and configured to provide a first output current at a first current level to the relay circuit for a first time period in response to the control signal causing the relay circuit to operate in the on state; and
    a holding circuit comprising a second resistor and configured to maintain the output current at a reduced second current level for a second time period to maintain the relay circuit in the on state;
  wherein the first current level is at least ten times greater than the second current level, the first time period is less than the second time period, and the first time period is greater than or equal to the maximum turn-on time.

2. A solid state relay according to claim 1, wherein the relay circuit and driving circuit are packaged in an integrated circuit (IC).

3. A solid state relay according to claim 1, wherein the turn-on circuit is one of a current source, a voltage pulse generator, a current pulse generator and a voltage converter.

4. A solid state relay according to claim 1, wherein the holding circuit is one of a current source, voltage pulse generator, current pulse generator or voltage converter.

5. The solid state relay of claim 1, wherein the second resistor has a first resistance greater than a second resistance of the second resistor.

6. The solid state relay of claim 1, wherein the first position is a closed position and the second position is an open position.

7. The solid state relay of claim 1, wherein the control signal is periodic.

8. The solid state relay of claim 1, wherein the turn-on circuit is configured to disengage from the energy conserving driving circuit upon termination of the first time period.

9. The solid state relay of claim 1, wherein said control circuit is configured to disengage the turn-on circuit.

10. The solid state relay of claim 1, wherein the holding circuit is configured to disengage from the energy conserving driving circuit upon termination of the second time period.

11. The solid state relay of claim 1, wherein said control circuit is configured to disengage the holding circuit.

12. The solid state relay of claim 1, wherein a resistance of the turn-on circuit is less than a resistance of the holding circuit.

13. The solid state relay of claim 1, wherein the control circuit is configured to determine the first time period and the second time period.

14. The solid state relay of claim 1, wherein the first and second time periods are determined by a charging time of an RC circuit or an RLC circuit.

15. The solid state relay of claim 1, wherein the control circuit is a device configured electrically to open and close as controlled by an input drive signal.

16. The solid state relay of claim 1, wherein the turn-on circuit is configured to be activate upon initiation of the first time period and is configured to be de-activated upon termination of the first time period.

17. The solid state relay of claim 1, wherein the holding circuit is configured to be activated upon initiation of the second time period and is configured to be de-activated upon termination of the second time period.

18. The solid state relay of claim 1, wherein the first current level ranges between about 3 mA and about 20 mA.

* * * * *